United States Patent
Galli et al.

[15] 3,664,867

[45] May 23, 1972

[54] COMPOSITE STRUCTURE OF ZINC OXIDE DEPOSITED EPITAXIALLY ON SAPPHIRE

[72] Inventors: Guido Galli, Saratoga; Jesse E. Coker, Orange, both of Calif.

[73] Assignee: North American Rockwell Corporation

[22] Filed: Nov. 24, 1969

[21] Appl. No.: 879,470

[52] U.S. Cl. ..........................................117/201, 117/106 R
[51] Int. Cl. .........................................B44d 1/02, B44d 1/18
[58] Field of Search ...........................117/201, 106 R, 106 A

[56] References Cited

UNITED STATES PATENTS 3,413,145 11/1968 Robinson et al. ......................117/201
3,294,660 12/1966 Kingeny et al. ....................117/201 X

*Primary Examiner*—William L. Jarvis
*Attorney*—L. Lee Humphries, H. Fredrick Hamann and Richard J. Rengel

[57] ABSTRACT

Composite heteroepitaxial structures of single crystal zinc oxide epitaxially deposited in a layer on a single crystal substrate of alpha-aluminum oxide (sapphire) and process for producing desired orientations of the zinc oxide single crystal layer corresponding to the orientation of the sapphire substrate surface.

12 Claims, 2 Drawing Figures

INVENTORS
GUIDO GALLI
JESSE E. COKER
BY Richard T. Kinzel
ATTORNEY

COMPOSITE STRUCTURE OF ZINC OXIDE DEPOSITED EPITAXIALLY ON SAPPHIRE

BACKGROUND OF THE INVENTION

1. Field of Invention

The present invention relates to heteroepitaxial structures and process for producing the same, and more particularly to deposition of zinc oxide in a single crystal state on sapphire with a crystallographic orientation influenced by the deposition surface of the sapphire substrate.

2. Description of the Prior Art

In the past, polycrystalline zinc oxide was found to provide combined piezoelectric attributes of higher coupling coefficients and stability not found in most of the prior materials having piezoelectric properties. In recent years, the development of semiconductor compounds for solid state electronic devices has resulted in a need for piezoelectric materials for microwave applications which are compatible with methods of producing monolithic integrated circuitry including large scale integration (LSI). Accordingly, to be compatible with monolithic circuitry formation technology, a need exists for a monocrystalline film or layer of piezoelectric material on a substrate providing a composite structure in which the piezoelectric material can be etched to a desired configuration and otherwise adapted to monolithic circuit forming techniques including forming of conductor interconnections on the surface of the layer of piezoelectric material. At the present time, epitaxially deposited films of semiconductor materials; e.g., silicon, germanium and gallium arsenide, on sapphire, have been produced. Attempts have been made to epitaxially deposit zinc oxide on sapphire using sputtering equipment, and while the thin films show some degree of orientation, the x-ray diffraction patterns clearly show polycrystalline traces. These attempts were unsuccessful in producing thick ZnO films or layers. The reason these attempts were unsuccessful is that the sputtering process is not suitable for producing thick films having characteristics of bulk crystals. Further, the sputtering process is limited to a relatively low rate of deposition ($\cong 1\mu$/hr) and often produces poor bonding to the substrate deposition surface such that films often separate from the substrate. The consequence of the bonding problem becomes more serious with increasing film thickness such that, in most instances the process is limited to the formation of thin films. The limitation in thickness is due to other practical considerations in that the sputtering process is deposited at an extremely low rate since faster rates have been found to produce crystalline defects and improper stoichiometry.

SUMMARY OF THE INVENTION

The composite heteroepitaxial structure of the present invention comprises a film or layer of monocrystalline zinc oxide deposited on a sapphire substrate (alpha-aluminum oxide $\alpha\, Al_2O_3$ or corundum). The process of deposition is by chemical vapor transport in hydrogen and hydrogen chloride gas in which the thickness of the deposit can be made to range from a continuous thin film to films of a desired thickness. An additional important feature of the present invention is the discovery that the crystallographic orientation of the single crystal zinc oxide deposit is controlled by the orientation of the sapphire substrate at the deposition surface. This epitaxial relationship provides for orientation of the C-axis either parallel tó the substrate deposition surface or normal to the substrate surface, for monolithic piezoelectric circuitry, for example. The versatility in achieving other orientations of the monocrystalline zinc oxide deposits has also been provided for other device applications. It is important to note that the crystallographic directions of the zinc oxide deposits are parallel to predetermined crystallographic directions of the sapphire substrate as described in detail in the description which follows.

It is an object of the present invention, therefore, to provide a composite heteroepitaxial deposit of monocrystalline zinc oxide on a sapphire substrate.

Another object is the provision of single crystal zinc oxide deposit of the desired orientation on a sapphire substrate.

Still another object of the invention is to provide a single crystal layer of zinc oxide, having bulk crystal characteristics, on a sapphire substrate.

A further object is to provide a process for producing single crystal zinc oxide deposits of the desired thickness on sapphire.

BRIEF DESCRIPTION OF THE DRAWINGS

Still other objects, features, and attendant advantages of the present invention will become apparent to those skilled in the art by the following detailed description of the preferred embodiments constructed in accordance therewith, taken in conjunction with the accompanying drawings wherein like numerals designate like parts in the several figures and wherein.

DESCRIPTION OF THE PREFERRED EMBODIMENT OF THE INVENTION

Figure 1:
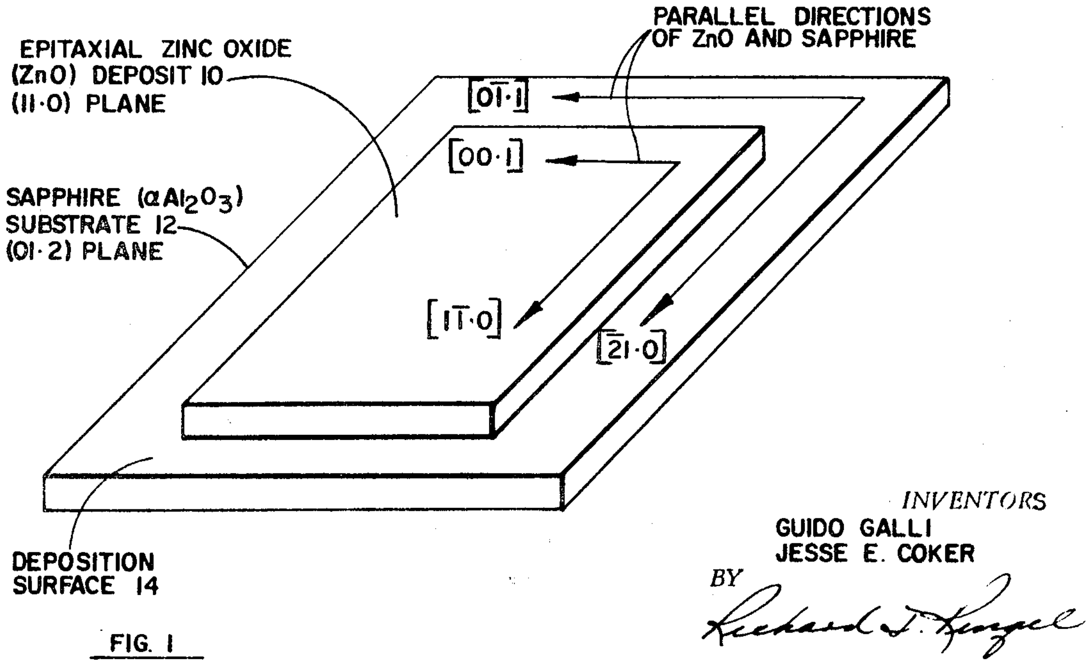
FIG. 1 is an enlarged perspective view of the composite heteroepitaxial structure of the preferred embodiment of the invention.

Referring to FIG. 1, an exemplary composite heteroepitaxial structure provided by the process of the present invention is shown to comprise a single crystal deposit or layer 10 of zinc oxide (ZnO) of the hexagonal wurtzite class epitaxially deposited on a single crystal substrate 12 of sapphire.

The order of the zinc oxide layer 10 is predetermined by the orientation of the sapphire substrate surface 14 upon which the layer is deposited. Further, a predetermined direction of the deposited monocrystalline zinc oxide layer 10 is parallel to a predetermined direction of the sapphire substrate surface 14, as will be made evident in the specific examples set forth hereinafter. Thus, the present process additionally provides C-axis orientation control for zinc oxide epitaxially deposited on sapphire; i.e., by specifying the cut or natural sapphire surface orientation, control of orientation of the C-axis of the zinc oxide layer over a wide range is provided.

As indicated by the arrows and the Miller indices of directions and planes in FIG. 1, the process of the present invention produces a single crystal layer 10 of zinc oxide in the (11·0) plane parallel to the surface 14 of the (01·2) plane of the sapphire. The [00·1 ] and [$\mathbf{1\bar{1}\cdot 0}$ ] crystallographic directions in the (11·0) ZnO layer 10 are parallel to the [$\mathbf{0\bar{1}\cdot 1}$ ] direction and [$\mathbf{\bar{2}1\cdot 0}$ ] direction, respectively, in the (01·2) substrate 12. For convenience in designating planes of sapphire, the reference system of the National Bureau of Standards for Indexing is used as set forth in NBS Circular 539, Volume II, pp 20–23, dated June 15, 1953. The sapphire substrate 12 is cut along a plane (when other than a natural surface) such that the surface 14 thereof, upon which the zinc oxide is to be deposited, is parallel to a specific crystallographic plane; i.e., a specific order of growth of the zinc oxide epitaxial deposit is induced by the orientation of sapphire to produce a single crystal zinc oxide layer in the desired orientation; e.g., (11·0) plane. Consistent epitaxial relationships of composite structures produced by the process of the present invention were determined by use of back-reflection Laué photographs using a 1mm diameter x-ray beam of unfiltered copper (Cu) radiation and verified by the use of a full circle goniometer in conjunction with an x-ray unit. Electron defraction patterns were also obtained, and Kikuchi bands were observed, which is an indication of good quality single crystal deposit.

The process of the present invention which provides for forming the composite heteroepitaxial structures comprises cutting or providing the single crystal sapphire substrate surface 14 of the sapphire having a (01·2) orientation, for example. The single crystal zinc oxide layer 10 is then deposited on the substrate surface 14 by chemical vapor transport in a close-spaced horizontal flowing system. For example, substrate 12 is suspended, inverted, approximately 0.5–2.0 centimeters above a powdered zinc oxide source material contained in a quartz boat, which is used also to support the inverted substrates with the surface 14 exposed directly above the powdered zinc oxide. Powdered zinc oxide (loose or compacted), or large bulk crystals can be used as the source material, although powdered zinc oxide is preferred for faster transport in the process. After evacuation of the system, palladium-purified hydrogen is introduced to one atmosphere and allowed to flow through the system.

The source and substrate are provided with individual radiant heaters located on the outside of the quartz system. After the temperature of the system is elevated to the desired deposition temperature of approximately between 200° C and the melting point of the zinc oxide, hydrogen chloride gas is introduced to provide 0.1 to 20 percent of the total gas concentration in the system. The substrate is maintained at a lower temperature than the zinc oxide source material. The preferred temperatures during transport that provide for deposition resulting in a growth rate of 1 micron per minute are a source powder temperature of 825° C and a substrate temperature of 775° C.

The average growth rate under the preferred conditions was of the order of 200 Angstrom units (A.) per second. Single crystal layers 100 microns thick were grown during growth periods of several hours. Deposition can be made slowly at rates of less than 1 mil per hour. Rates faster than 5 mils per hour will, in general, result in a poorer crystal. The range of conditions provides for temperatures from 200° C to the melting point of the zinc oxide crystal (approximately 1,800° C). The preferred lower limit of the deposition range is approximately 600° C since a lower temperature provides little transport. The upper limit of the temperature range is governed by the volatility of the ZnO (i.e., temperatures too high will cause etching of the deposit). With regard to the introduction of the hydrogen chloride (HCl) gas, the preferred process includes a HCl gas concentration of less than 20 percent; the preferred concentration to be used is approximately 2 percent. Higher concentration of HCl gas often causes removal of the zinc oxide deposit on the substrate by etching; this technique can be used to clean the substrates while in the reactor, before deposition.

The reaction with use of HCl gas in the process of vapor transport is defined as follows:

$$ZnO + 2HCl + H_2 \leftrightarrows ZnCl_2 + H_2O + H_2$$

Another reaction with less satisfactory growth rate is defined as follows:

$$ZnO + H_2 \leftrightarrows Zn + H_2O$$

The ZnO shown in the above reactions includes the ZnO vapor as well as solid ZnO; e.g., ZnO has an appreciable vapor pressure at the deposition temperatures.

The substrates used in the exemplary process are 0.010 inch thick wafers, cut from Czochralski grown sapphire, mechanically polished on both sides. Preferably, the wafers are processed for use by ultrasonic cleaning in deionized water containing detergent followed by a clear deionized water rinse and a hot vapor bath in propanol. The zinc oxide is chemical reagent grade available from various sources and need not be of high purity. The vapor transport process purifies the deposited material to some extent; however, a high purity source material may be required in some instances.

In the present process, the choice of single crystal substrate and its specific orientation will determine the orientation of the epitaxial deposit. Zinc oxide has a hexagonal crystal lattice with a strong piezoelectric effect in the direction of the C-axis. Preparation of a directional transducer having the desired piezoelectric properties in which both electrodes are on the top surface of the ZnO film require that the C-axis be in the plane of the single crystal zinc oxide layer.

Initially, therefore, the substrates chosen for epitaxial deposits to produce zinc oxide layers were wafers cut along the (01·2) plane of the sapphire. The resulting deposits were determined to be single crystal with the C-axis of the layer 10 parallel to the (01·2) plane of the deposition surface 14 of the sapphire substrate. Further, it was determined that, in addition to this predetermined orientation of the plane of the zinc oxide deposit with respect to the sapphire substrate deposition surface, the [$0\bar{1}$·1 ] direction in the substrate and the C-axis [00·1 ] of the deposit (and equivalent direction <00·1>) are parallel.

The importance of the foregoing can be appreciated by reference to its use in piezoelectric device applications. The epitaxial deposits of zinc oxide which have the C-axis parallel to the surface of the sapphire substrate, i.e., the (01·2) orientation, are desirable for microwave applications. The C-axis or [00·1 ] direction of the zinc oxide deposit 10 provides desirable piezoelectric properties, maximum coupling coefficient and minimum velocity in the direction of the C-axis. Thus, these deposits can be used in fabrication of microwave delay lines. In the direction 90° from the C-axis (i.e., along the Y-axis or [$1\bar{1}$·0 ] direction), the piezoelectric properties of maximum velocity and minimum coupling coefficient are provided.

The advantage of epitaxial layers of zinc oxide is due in part to the resulting ease in device fabrication. The deposited layer having an orientation for desired piezoelectric properties can be etched with HCl or other etchants to the desired configuration, doped with lithium, for example, to provide desired higher resistivity, and polished to provide a surface suitable for electrode deposition. The present composite structure of zinc oxide deposited on sapphire has an interface which provides isolation because of the difference in velocity of acoustic waves in zinc oxide and sapphire; i.e., the velocity of wave transmission through the zinc oxide layer is much slower than through the sapphire substrate.

Another advantage in fabrication satisfies the present day need in semiconductor or integrate circuit planar technology of monolithic structures including forming of conductor or lead connections with gold, aluminum or other conductive material on a single side of a wafer by evaporation of the conductive material on the zinc oxide deposited side and etching to form the desired circuit connections.

Figure 2:
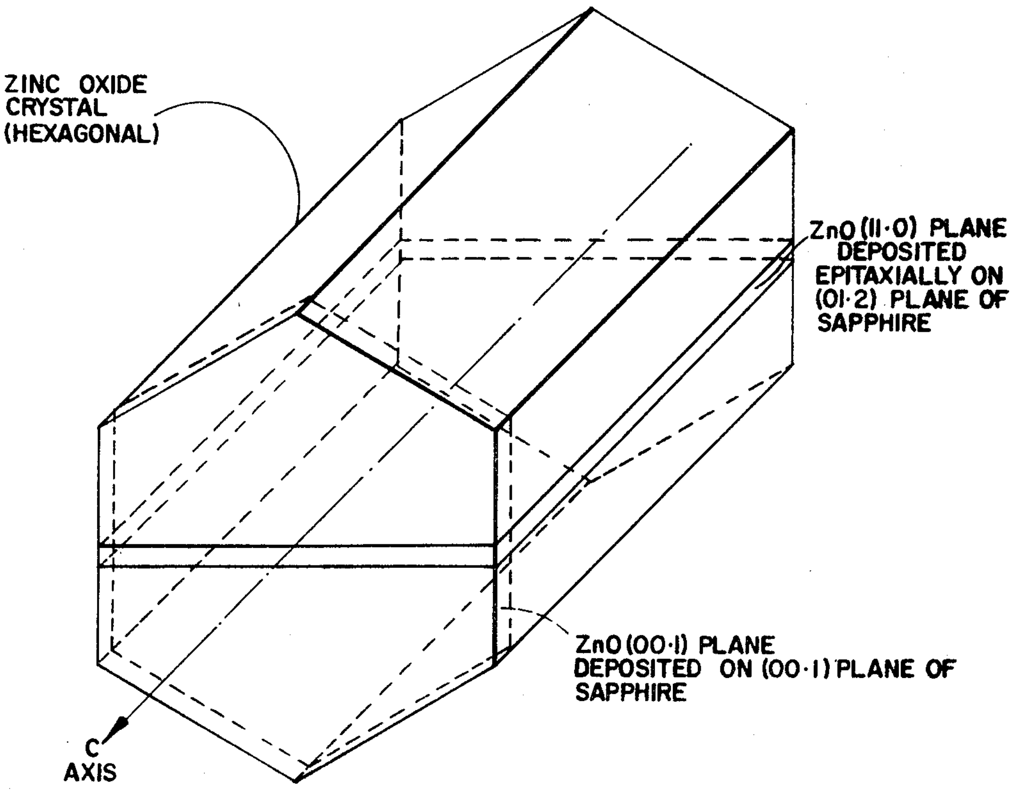
FIG. 2 is perspective view of a hexagonal crystal of zinc oxide showing preferred plane orientations of the epitaxial deposit of FIG. 1.

Another equally important orientation of the zinc oxide epitaxial deposit is provided by the present process in which the C-axis of the deposit is normal to the substrate. The piezoelectric properties of the (00·1) ZnO deposits provide omnidirectional wave transmission in the plane of the deposit instead of directional wave transmission as provided by the orientation shown in FIG. 1. In this embodiment, the zinc oxide is epitaxially deposited on the sapphire ($\alpha$ $Al_2O_3$) substrate having a surface orientation in the basal (00·1) plane (shown in FIG. 2) to provide basal (00·1) plane orientation of the zinc oxide deposit. The [$\bar{1}2$·0 ] directions of the zinc oxide are parallel to the [$\bar{1}1$·0 ] directions of the sapphire substrates when (00·1) substrates are used.

In other examples of the process of the present invention, zinc oxide is epitaxially deposited on the surfaces of substrates in the zone including (11·2), (11·3), (11·4) and (11·6) planes to produce zinc oxide layers in or near the (41·2), (10·0), (41·2) and (10·5) planes, respectively. As in the previously mentioned examples of zinc oxide deposits in the (11·0) and basal (00·1) planes on respective (01·2) and (00·1) surfaces of the sapphire substrates, the directions of the zinc oxide deposits are parallel to predetermined directions of the respective sapphire substrates. In the zone including sapphire substrate(s) with surfaces which display planes (11·2), (11·3) and (11·4) the zinc oxide epitaxial deposit C-axis direction [00·1 ] is near the [$0\bar{1}$·1 ] direction of the sapphire substrate. The [$\bar{1}2$·0 ] direction of the epitaxial (10·5) zinc oxide deposit on the surface of the sapphire substrate oriented to the (11·6) plane is parallel to the [$20$·$\bar{1}$ ] direction of the sapphire.

For microwave device applications in which surface waves are transmitted by Rayleigh mode of generation, the thickness of the film or layer of zinc oxide must be two to three times the wavelength of the signal. Thus, for frequencies of approximately 100 to 150 megahertz (MHz), the zinc oxide deposit should preferably be two to three thousandths of an inch thick.

In the light of the above teachings of the preferred embodiments disclosed various modifications and variations of the present invention are contemplated and will be apparent to those skilled in the art without departing from the spirit and scope of the invention.

What is claimed is:

1. A composite comprising a monocrystalline sapphire substrate and a layer of single crystal zinc oxide having bulk crystal characteristics and being substantially free of polycrystalline materials on said substrate.

2. The composite according to claim 1 in which the order of said zinc oxide layer is predetermined by the orientation of the sapphire substrate.

3. The composite according to claim 2 in which the plane of orientation of said zinc oxide layer is parallel to the plane of orientation of said sapphire substrate.

4. The composite according to claim 2 in which the C-axis of said zinc oxide layer is parallel to the deposition surface of said sapphire substrate.

5. The composite according to claim 2 in which the C-axis of said deposit is normal to the orientation of the deposition surface of said substrate.

6. The composite according to claim 2 in which the orientation of the deposition surface of said substrate plane is selected in the zone including the planes (11·2), (11·3) and (11·4) or equivalent planes and the resulting orientation of the deposit of zinc oxide on said substrate is substantially parallel to the (41·2), (10·0) and (41·2), respectively, or equivalent planes {41·2}, {10·0} and {41·2}.

7. The composite according to claim 1 in which the deposition surface of the sapphire substrate is parallel to the (01·2) plane including equivalent planes ($\bar{1}$0·2), (1$\bar{1}$·2) and said layer is parallel to the (11·0) plane including equivalent planes (11·0).

8. The composite according to claim 1 in which said layer is greater than 3 microns in thickness.

9. A process for producing an epitaxial deposit of monocrystalline zinc oxide having bulk crystal characteristics and being substantially free of polycrystalline material on a substrate of monocrystalline sapphire comprising:

a. disposing a zinc oxide source material and said sapphire substrate for vapor transport;

b. heating said source material to a temperature of from 200° C to the melting point of zinc oxide to produce zinc oxide vapor; and c. transporting said zinc oxide vapor by means of a gas taken from the group consisting of hydrogen, helium, argon and nitrogen to deposit zinc oxide epitaxially on said substrate.

10. The process according to claim 9 in which said gas is hydrogen containing 0.1 to 20 percent by volume hydrogen chloride.

11. The process of claim 9 in which said substrate is provided with a deposition surface having an orientation selected to produce a zinc oxide deposit having a predetermined orientation.

12. The process of claim 9 in which the temperature of the zinc oxide source material is maintained at approximately 825° C and the temperature of the substrate is maintained at approximately 775° C.

* * * * *